US 6,541,833 B2

(12) United States Patent
Werner et al.

(10) Patent No.: US 6,541,833 B2
(45) Date of Patent: Apr. 1, 2003

(54) MICROMECHANICAL COMPONENT WITH SEALED MEMBRANE OPENINGS AND METHOD OF FABRICATING A MICROMECHANICAL COMPONENT

(75) Inventors: Wolfgang Werner, München (DE); Stefan Kolb, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 68 days.

(21) Appl. No.: 09/794,663

(22) Filed: Feb. 27, 2001

(65) Prior Publication Data

US 2001/0024711 A1 Sep. 27, 2001

Related U.S. Application Data

(63) Continuation of application No. PCT/DE99/02625, filed on Aug. 20, 1999.

(30) Foreign Application Priority Data

Aug. 27, 1998 (DE) .......................................... 198 39 124

(51) Int. Cl.$^7$ ................................................. H01L 29/82
(52) U.S. Cl. ........................ 257/419; 257/418; 438/53; 361/283.4
(58) Field of Search ................................ 257/419, 418; 438/53; 361/283.4

(56) References Cited

U.S. PATENT DOCUMENTS 4,665,610 A * 5/1987 Barth ................ 148/DIG. 159
4,849,071 A * 7/1989 Evans et al. .................... 216/2
5,177,661 A   1/1993 Zavracky et al.
5,316,619 A   5/1994 Mastrangelo
5,427,975 A   6/1995 Sparks et al.
5,759,870 A   6/1998 Yun et al.

FOREIGN PATENT DOCUMENTS

| DE | 44 01 999 A1 | 8/1994 |
| DE | 43 32 843 A1 | 4/1995 |
| DE | 196 08 370 A1 | 7/1996 |
| EP | 0 624 900 A2 | 11/1994 |
| EP | 0 783 108 A1 | 7/1997 |
| JP | 6-252420 | 9/1994 |
| JP | 7-15019 | 1/1995 |
| JP | 7-504509 | 5/1995 |
| JP | 9-199496 | 7/1997 |

OTHER PUBLICATIONS

International Publication WO 99/58985 (Aigner et al.), dated Nov. 18, 1999.

* cited by examiner

Primary Examiner—Jerome Jackson
(74) Attorney, Agent, or Firm—Laurence A. Greenberg; Werner H. Stemer; Gregory L. Mayback

(57) ABSTRACT

The method for producing a micromechanical component includes the following steps: producing a semi-finished micromechanical component; producing openings and forming a cavity; sealing the opening with sealing lids; removing material on the top surface of the first membrane layer, the surface of the first membrane layer being exposed and planarized. The invention also relates to a micromechanical component which can be produced according to the above method and to its use in sensors such as pressure sensors, microphones, or acceleration sensors.

14 Claims, 1 Drawing Sheet

MICROMECHANICAL COMPONENT WITH SEALED MEMBRANE OPENINGS AND METHOD OF FABRICATING A MICROMECHANICAL COMPONENT

CROSS-REFERENCE TO RELATED APPLICATION

This application is a continuation of copending International Application No. PCT/DE99/02625, filed Aug. 20, 1999, which designated the United States.

BACKGROUND OF THE INVENTION

FIELD OF THE INVENTION

The invention lies in the field of micromechanics. More specifically, the invention relates to a method for producing a micromechanical component, in particular a micromechanical sensor, and to a micromechanical component comprising a wafer, a cavity formed above the wafer with a membrane situated thereabove, at least one sacrificial layer serving as support surface for the membrane, and at least one membrane opening which is formed in the region of the cavity and sealed with a sealing cover. The invention further pertains to the use of such a component in sensors such as, for example, pressure sensors in microphones or acceleration sensors.

A micromechanical sensor with openings in the membrane layer for pressure measurements is known from the commonly assigned published European patent application EP 0 783 108. That pressure sensor has a cavity which is bounded above the cavity essentially by a membrane formed from an electrically conductive layer. The membrane layer, which can consist of doped polycrystalline silicon or metal, for example, forms, in common with a counter-electrode arranged on the underside of the cavity, an electric capacitor which can be used to measure the change in volume of the cavity with time. The counter-electrode can be formed, for example, by a doped region in the underlying substrate wafer. It is also possible for piezoresistive elements which record movements of the membrane surface to be incorporated into the membrane material.

The prior art micromechanical sensor consists essentially of materials which are normally used in semiconductor production. Consequently, it is possible for the sensor to be arranged in common with an integrated electronic drive and/or evaluation system on the chip of the sensor.

According to EP 0 783 108, the first step in producing the micromechanical sensor is to apply a sacrificial layer to a suitable wafer material. This is followed by coating with a membrane material by making use of a mask. The mask gives rise in the membrane surface to openings through which, in a subsequent step, a cavity is etched selectively with reference to the substrate and membrane materials. By comparison with etching the cavity via lateral channels, the mode of procedure via an etching method from the top side is advantageous owing to a reduced etching time. After production of the cavity, the openings in the membrane must be resealed. For this purpose, a layer made from borophosphorus glass (BPSG) is applied, whose thickness is selected such that at most a narrow gap remains above the openings in the membrane after the deposition.

Thereafter, heat (thermal) treatment at approximately 1000° C. is carried out, during which the BPSG layer melts and the holes are sealed. A layer made from the sealing material remains in the form of a skin on the top side and bottom side of the membrane. This gives rise to a membrane assembly which consists of two different materials. Given the different membrane material, the different material properties result in mechanical loads and non-reproducible properties of the micromechanical sensor. A further disadvantage is the sensitivity of the oxide material, used to seal the membrane openings, to external environmental influences such as atmospheric humidity, for example.

SUMMARY OF THE INVENTION

It is accordingly an object of the invention to provide a method of fabricating a micromechanical component and a corresponding component, which overcomes the above-mentioned disadvantages of the heretofore-known devices and methods of this general type and which overcomes the disadvantages of prior art micromechanical components with sealed openings in the membrane surface. A further object of the invention is to provide a micromechanical component, preferably a micromechanical sensor, having an improved resistance to external environmental influences.

With the foregoing and other objects in view there is provided, in accordance with the invention, a method of producing a micromechanical component, which comprises the following method steps:

producing a semi-finished micromechanical component comprising a wafer, a first membrane layer, and one or more sacrificial layers supporting the first membrane layer;

forming openings in the first membrane layer after or during the application of the first membrane layer;

removing material of the sacrificial layer through the openings to form a cavity;

sealing the openings with sealing covers;

removing material on a top side of the first membrane layer, for exposing the surface of the first membrane layer and planarizing the first membrane layer; and subsequently applying a second membrane layer on the first membrane layer.

In accordance with an added feature of the invention, the removing step comprises removing sealing material by back etching, such as by wet chemical etching or dry etching.

In accordance with an additional feature of the invention, the sealing step comprises depositing an oxide material on the first membrane layer, heating the oxide material to a temperature at which the deposited oxide material flows and seals the openings, and cooling the oxide material to a temperature at which the oxide material hardens.

The material required in producing the sealing covers is preferably removed when removing material on the top side of the first membrane layer.

The exposure of the openings is preferably performed by demasking regions during the membrane production. In this process, the shape of the openings is arbitrary and determined by the application of the micromechanical component. The regions can be round, angular or strip-shaped, for example. It is also possible for the regions to have the shape of annularly closed strips.

The removal of the material of the sacrificial layer is preferably carried out by an etching method known per se which is selective with reference to the membrane and the wafer.

The application of the second membrane layer to the first membrane layer is carried out to protect the sealed first membrane layer against external influences. In particular, the second membrane layer protects the sealing covers arranged in the first membrane layer against external influences.

According to a preferred embodiment of the invention, the sealing covers are sealed using a method which comprises the steps of a) applying an oxide material to the first membrane layer, and b) raising the temperature such that the oxide material applied melts and seals the openings. Depending on the material used to seal the openings, during the heat treatment surface effects can lead to wetting of the surfaces in contact with the material applied. This wetting leads to the formation of a skin of the oxide material. According to the invention, there is no such oxide skin on the top side of the first membrane layer.

With the above and other objects in view there is also provided, in accordance with the invention, a micromechanical component, comprising:

a wafer;

at least one sacrificial layer having a cavity formed therein;

a first membrane layer disposed on the sacrificial layer, having a top side and having formed therein at least one membrane opening in a region of the cavity;

a sealing cover sealing the at least one membrane opening and being formed of a different material than the first membrane layer, wherein substantially no skin of a material corresponding to the material of the sealing cover is disposed on the top side of the first membrane layer; and a second membrane layer disposed directly on the first membrane layer.

In accordance with another feature of the invention, the sealing cover if formed of an oxide.

In accordance with a further feature of the invention, the sealing covers and the first membrane layer together form a substantially flat surface on the top side of the first membrane layer.

In accordance with again a further feature of the invention, the first membrane layer has a thickness in a range from substantially 0.2 $\mu$m to substantially 20 $\mu$m, the first membrane layer and the second membrane layers are formed of the same material, and the second membrane layer has a thickness in a range from about 0.01 $\mu$m to about 10 $\mu$m.

The invention also relates to the use of the previously described micromechanical components according to the invention for sensors, in particular pressure sensors, microphones and acceleration sensors.

The production of sealed membranes is preferably performed by applying a masking layer made from a doped glass in accordance with EP 0 783 108, or by applying a suitable material by vapor deposition or sputtering. A method for vapor deposition or sputtering of a layer in order to produce a sealed membrane is described in German patent application DE 43 32 843.

The micromechanical component in accordance with the present invention can also have a movable arrangement which is incorporated into the membrane and serves to receive signals in the event of accelerations. Appropriate structures are known from the prior art.

In a further preferred embodiment of the invention, the second membrane layer is of very much thinner design than the first membrane layer. The thickness of the second membrane layer is then, in particular, in the range from approximately 3 nm to approximately 1 $\mu$m.

Other features which are considered as characteristic for the invention are set forth in the appended claims.

Although the invention is illustrated and described herein as embodied in a micromechanical component with sealed membrane openings, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING FIGURES

DESCRIPTION OF THE PREFERRED EMBODIMENTS

Figure 1:
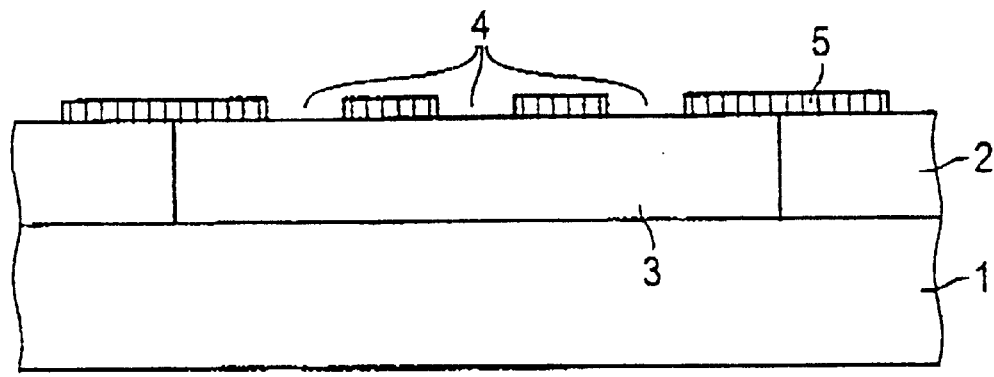
FIG. 1 is a partial diagammatic side view of a semifinished micromechanical component for a sensor, with unsealed openings 4 in the first membrane layer 5.

Referring now to the figures of the drawing in detail and first, particularly, to FIG. 1 thereof, there is shown a semifinished micromechanical sensor which can be produced using the method disclosed in the above-noted European patent application EP 0 783 108, or using another method customary in the prior art for producing micromechanical sensors with openings 4 arranged in the membrane surface. The first step is to apply a sacrificial layer 2, preferably made from silicon oxide, to a wafer 1. Subsequently, the sacrificial layer is coated with polycrystalline silicon, an etching mask being applied in the region of the openings 4. So-called freely etched holes are produced in the membrane. The thickness of the first membrane layer 5 is 1 $\mu$m. The first membrane layer can alternatively also consist of a monocrystalline silicon. The sacrificial layer 2 is then etched down to the wafer 1 with the aid of an isotropic etching process, such that a cavity 3 is produced below the first membrane layer.

Figure 2:
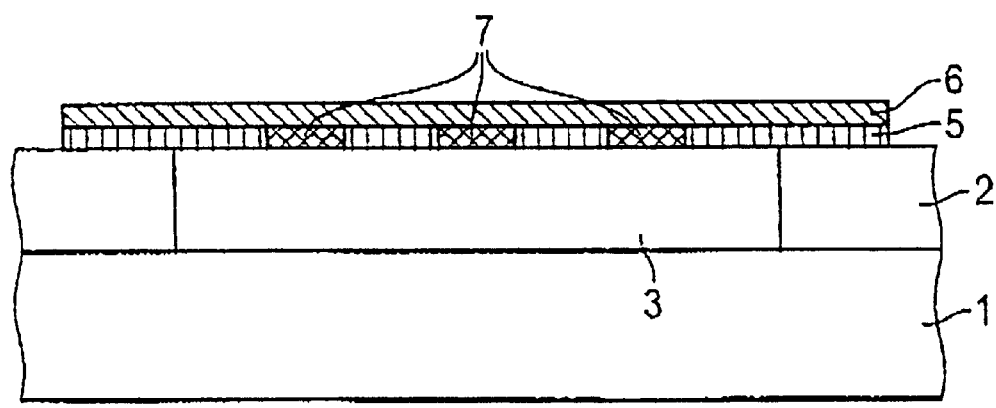
FIG. 2 is a partial diagrammatic side view of a micromechanical component according to the invention for a sensor with a sealed membrane structure.

Moreover, a BPSG layer is then applied to the first membrane layer using a conventional process. In addition to BPSG, it is also possible to use any other suitable material, although in this case an oxide material such as, in particular, doped glass, silicon dioxide or glass doped with boron and/or with phosphorus is preferably used. There then follows a thermal l melting process at approximately 800 to 1100° C., which leads to the formation of a skin on the first membrane layer 5. After the melting process, the openings 4 are sealed with sealing covers 7 made from BPSG. However, it is also possible for the openings already to be adequately sealed even without a melting process, for example when the openings are small or the layer is of sufficient thickness. The size of the openings 4 is selected such that the openings are sealed by the BPSG material. If a melting process is carried out, the maximum size of the openings is substantially determined by the surface tension of the coating material at the melting temperature used, and by the thickness of the first membrane surface. Owing to surface effects, a skin made from sealing material with a thickness which is preferably in the range from approximately 0.1 $\mu$m to approximately 1 $\mu$m is formed above the first membrane surface. As shown in FIG. 2, a back-etching process is now carried out in which the skin of sealing material located on the first membrane layer is entirely removed. A first membrane layer 5 with a flat surface is produced. Sealing material remains only in the openings 4. The back-etching process can be a wet-chemical or a dry process, the etching time being determined by the thickness of the layer applied for sealing. If the etching time is selected to be too long, no first membrane layer with a flat surface is produced. If, by contrast, the etching time is selected to be too short, undesired residues of the material used for sealing remain on the membrane. Following the back etching, a second membrane layer 6 is deposited onto the first membrane layer. The material for the second membrane layer is preferably selected in this case such that the mechanical properties correspond to the mechanical properties of the first membrane layer as far as possible. Polycrystalline silicon is then particularly preferred as material for the second membrane layer. However, it is also conceivable for the second membrane layer to consist of a metal.

The micromechanical component according to the invention behaves with respect to external influences, for example air humidity, in a neutral fashion, that is to say its properties such as, for example, the sensor properties and the sensor characteristic, virtually do not change over a lengthy period of use.

A further advantage of the micromechanical component according to the invention is that the surface of the membrane structure comprising first and second membrane surfaces can be configured to be entirely flat. This is advantageous, in particular, for mounting the micromechanical component in a housing of a sensor.

The method of the invention advantageously permits the second membrane layer to be selected freely. Consequently, the material properties of the membrane structure can be set specifically in conjunction with the first membrane layer.

Figure 3:
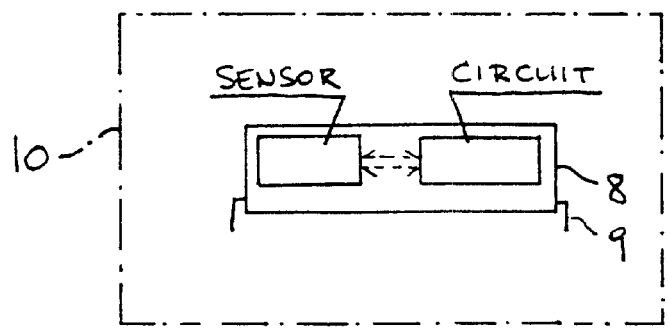
FIG. 3 is a diagrammatic illustration of the direct integration of the micromechanical component on a chip together with its driver and evaluation circuit, as well as the mounting of the chip in a sensor housing.

With reference to the highly diagammatic drawing FIG. 3, the component, such as a sensor, may be integrated in the same chip 8 together with its drive and/or evaluation circuit. The chip can be connected at its leads 9. In a further embodiment of the invention, the component which is embodied as a sensor may be disposed directly in a sensor housing 10, which is indicated in FIG. 3 with a dash-dotted outline.

We claim:

1. A method of producing a micromechanical component, which comprises the following method steps:
    producing a semi-finished micromechanical component comprising a wafer, a first membrane layer, and one or more sacrificial layers supporting the first membrane layer;
    forming openings in the first membrane layer;
    removing material of the sacrificial layer through the openings to form a cavity;
    sealing the openings with sealing covers;
    removing material on a top side of the first membrane layer, for exposing the surface of the first membrane layer and planarizing the first membrane layer;
    forming the first membrane layer and a second membrane layer with the same material; and
    subsequently applying the second membrane layer on the first membrane layer.

2. The method according to claim 1, which comprises forming the openings after or during an application of the first membrane layer.

3. The method according to claim 1, wherein the removing step comprises removing sealing material by back etching.

4. The method according to claim 3, wherein the back etching step is selected from the group of wet chemical etching and dry etching.

5. The method according to claim 1, wherein the sealing step comprises depositing an oxide material on the first membrane layer, heating the oxide material to a temperature at which the deposited oxide material flows and seals the openings, and cooling the oxide material to a temperature at which the oxide material hardens.

6. A micromechanical component, comprising:
    a wafer;
    at least one sacrificial layer having a cavity formed therein;
    a first membrane layer formed with a given material and disposed on said sacrificial layer, having a top side and having formed therein at least one membrane opening in a region of said cavity;
    a sealing cover sealing said at least one membrane opening and being formed of a different material than said first membrane layer, wherein substantially no skin of a material corresponding to the material of said sealing cover is disposed on said top side of said first membrane layer; and
    a second membrane layer formed with said given material and disposed directly on said first membrane layer.

7. The micromechanical component according to claim 6, wherein said sealing cover if formed of an oxide.

8. The micromechanical component according to claim 6, wherein said sealing covers and said first membrane layer together form a substantially flat surface on said top side of said first membrane layer.

9. The micromechanical component according to claim 6, wherein said first membrane layer has a thickness in a range from substantially 0.2 $\mu$m to substantially 20 $\mu$m.

10. The micromechanical component according to claim 6, wherein said second membrane layer has a thickness in a range from substantially 0.01 $\mu$m to substantially 10 $\mu$m.

11. An integrated chip, comprising a driver circuit and a micromechanical component according to claim 6 connected to and cointegrated with said driver circuit.

12. The integrated chip according to claim 11, wherein said micromechanical component is a sensor and said driver circuit is an evaluation circuit.

13. A sensor device comprising the micromechanical component according to claim 6.

14. The sensor device according to claim 13, which comprises a sensor housing and said micromechanical component disposed in said sensor housing.

* * * * *